United States Patent
Schätzle et al.

(10) Patent No.: US 10,701,825 B2
(45) Date of Patent: Jun. 30, 2020

(54) PLASTIC ELECTRICAL HOUSING

(71) Applicant: VEGA GRIESHABER KG, Wolfach (DE)

(72) Inventors: Ralf Schätzle, Fischerbach (DE); Fabian Witt, Hofstetten (DE)

(73) Assignee: Vega Grieshaber KG, Wolfach (DE)

( * ) Notice: Subject to any disclaimer, the term of this patent is extended or adjusted under 35 U.S.C. 154(b) by 0 days.

(21) Appl. No.: 16/371,827

(22) Filed: Apr. 1, 2019

(65) Prior Publication Data

US 2019/0335598 A1 Oct. 31, 2019

(30) Foreign Application Priority Data

Apr. 26, 2018 (DE) .................. 10 2018 110 026

(51) Int. Cl.
*H05K 5/02* (2006.01)
*H02G 3/08* (2006.01)
*H01R 4/30* (2006.01)

(52) U.S. Cl.
CPC ............ *H05K 5/0247* (2013.01); *H01R 4/30* (2013.01); *H02G 3/085* (2013.01); *H05K 5/0286* (2013.01)

(58) Field of Classification Search
CPC .. H05K 5/0247; H05K 5/0286; H01R 25/006; H01R 4/30; H01R 9/0512; H01R 13/6596; H02G 3/085
See application file for complete search history.

(56) References Cited

U.S. PATENT DOCUMENTS

| 3,617,811 | A | * | 11/1971 | McVoy | H03H 7/48 439/63 |
| 4,249,035 | A | * | 2/1981 | Watley | H02B 1/42 174/51 |
| 4,306,109 | A | * | 12/1981 | Nattel | H02G 3/083 174/51 |
| 5,066,832 | A | * | 11/1991 | Clarey | H02B 1/16 174/50 |
| 5,280,132 | A | * | 1/1994 | Clarey | H02B 1/16 174/50 |
| 7,157,643 | B2 | | 1/2007 | Drane | |
| 7,538,270 | B2 | * | 5/2009 | Herth | H02G 3/121 174/50 |
| 8,779,284 | B2 | * | 7/2014 | Wagner | H02G 3/081 174/50 |

FOREIGN PATENT DOCUMENTS

DE 3815032 A1 11/1989
DE 29720510 U1 3/1999

* cited by examiner

*Primary Examiner* — Robert J Hoffberg
(74) *Attorney, Agent, or Firm* — William Gray Mitchell

(57) ABSTRACT

An electrical housing made from plastic, comprising a bottom housing part with walls forming a housing bottom and a plurality of side walls, wherein the walls form a housing opening, wherein at least one of the walls has a plurality of positions for arranging cable glands, and a top housing part adapted to the bottom housing part for closing the housing opening in a sealing manner, wherein at least one metallic screw connection plate with threads for the attachment of cable glands integrated into the screw connection plate is disposed in the housing interior, wherein the screw connection plate is oriented and arranged such that the threads are oriented so as to correspond to the positions.

12 Claims, 4 Drawing Sheets

PLASTIC ELECTRICAL HOUSING

CROSS REFERENCE TO RELATED APPLICATIONS

This patent application claims priority to German Patent Application 10 2018 110 026.4, filed on Apr. 26, 2018.

STATEMENT REGARDING FEDERALLY SPONSORED RESEARCH OR DEVELOPMENT

No federal government funds were used in researching or developing this invention.

NAMES OF PARTIES TO A JOINT RESEARCH AGREEMENT

Not applicable.

SEQUENCE LISTING INCLUDED AND INCORPORATED BY REFERENCE HEREIN

Not applicable.

BACKGROUND

Field of the Invention

The present invention relates to a plastic electrical housing.

Background of the Invention

Various plastic electrical housings, which are used as junction or distributor boxes for electrical lines or as a housing for field devices, for example, are known from the prior art. Typically, such plastic electrical housings have a bottom housing part with walls forming a housing bottom and a plurality of side walls, wherein the side walls form a housing opening, and at least one of the walls has a plurality of positions for arranging cable glands. The electrical housing further includes a top housing part adapted to the bottom housing part for closing the housing opening in a sealing manner.

At the positions for arranging the cable glands, the housings frequently have so-called break-out openings into which, when the latter have been removed from the housing, the cable glands can be inserted. The break-out opening are advantageous in that the housings can be configured in a variable manner, i.e. that only the number of cable glands have to be attached that are actually required. For this purpose, the cable glands are routed through the opening and, from the inside of the housing, secured with at least one nut.

The fact that the cable glands are only insufficiently mechanically attached is perceived as disadvantageous in this variant known from the prior art. In particular, the plastic housing may rupture due to the load from the nut in the case of lateral forces acting on the cable gland, and thus become leaky and unusable.

In a further development, a metal plate is disposed in the housing interior, for stabilizing the housing and absorbing the forces produced. The metal plate also has an opening, through which the cable gland is routed and then secured with a nut.

The construction space required for the assembly of the plate and the nut as well as the increased number of required components are perceived as being disadvantageous in this variant.

It is the object of the present invention to develop a plastic electrical housing in such a way that the latter can be manufactured to be variable, rugged and compact.

This object is achieved with a plastic electrical housing with the features of patent claim 1. Advantageous embodiments are specified in the dependent claims.

BRIEF SUMMARY OF THE INVENTION

In a preferred embodiment, an electrical housing (1) made from plastic, comprising: a bottom housing part (3) with walls (31) forming a housing bottom (30) and a plurality of side walls, wherein the walls (31) form a housing opening (32), wherein at least one of the walls (31) has a plurality of positions (34) for arranging cable glands (40), a top housing part (5) adapted to the bottom housing part (3) for closing the housing opening (32) in a sealing manner, characterized in that at least one metallic screw connection plate (7) with threads (70) for the attachment of cable glands (40) integrated into the screw connection plate (7) is disposed in the housing interior, wherein the screw connection plate (7) is oriented and arranged such that the threads (70) are oriented so as to correspond to the positions (34).

In another preferred embodiment, the electrical housing (1) as described herein, characterized in that the housing (1) has a guide (9) for the screw connection plate (7).

In another preferred embodiment, the electrical housing (1) as described herein, characterized in that the guide (9) is configured in such a way that the screw connection plate (7) is secured in a clamping manner.

In another preferred embodiment, the electrical housing (1) as described herein, characterized in that the walls (31) have break-out openings (35) at the positions (34).

In another preferred embodiment, the electrical housing (1) as described herein, characterized in that the screw connection plate (7) has at least one grounding lug (72).

In another preferred embodiment, the electrical housing (1) as described herein, characterized in that the cable glands (40) are connected to the screw connection plate (7) in an electrically conductive manner.

In another preferred embodiment, the electrical housing (1) as described herein, characterized in that the cable glands (40) are made from a metal.

In another preferred embodiment, the electrical housing (1) as described herein, characterized in that the screw connection plate (7) has at least one additional thread (77) for the attachment of an external grounding (80).

In another preferred embodiment, the electrical housing (1) as described herein, characterized in that the additional thread (77) is configured as a fine thread (87).

In another preferred embodiment, the electrical housing (1) as described herein, characterized in that the external grounding (80) is sealed by means of an O-ring (84).

In another preferred embodiment, the electrical housing (1) as described herein, characterized in that the cable glands (40) are sealed by means of O-rings (84).

In another preferred embodiment, the electrical housing (1) as described herein, characterized in that the housing (1) is made from a polymer material, preferably from polycarbonate.

DETAILED DESCRIPTION OF THE INVENTION

Figure 1:
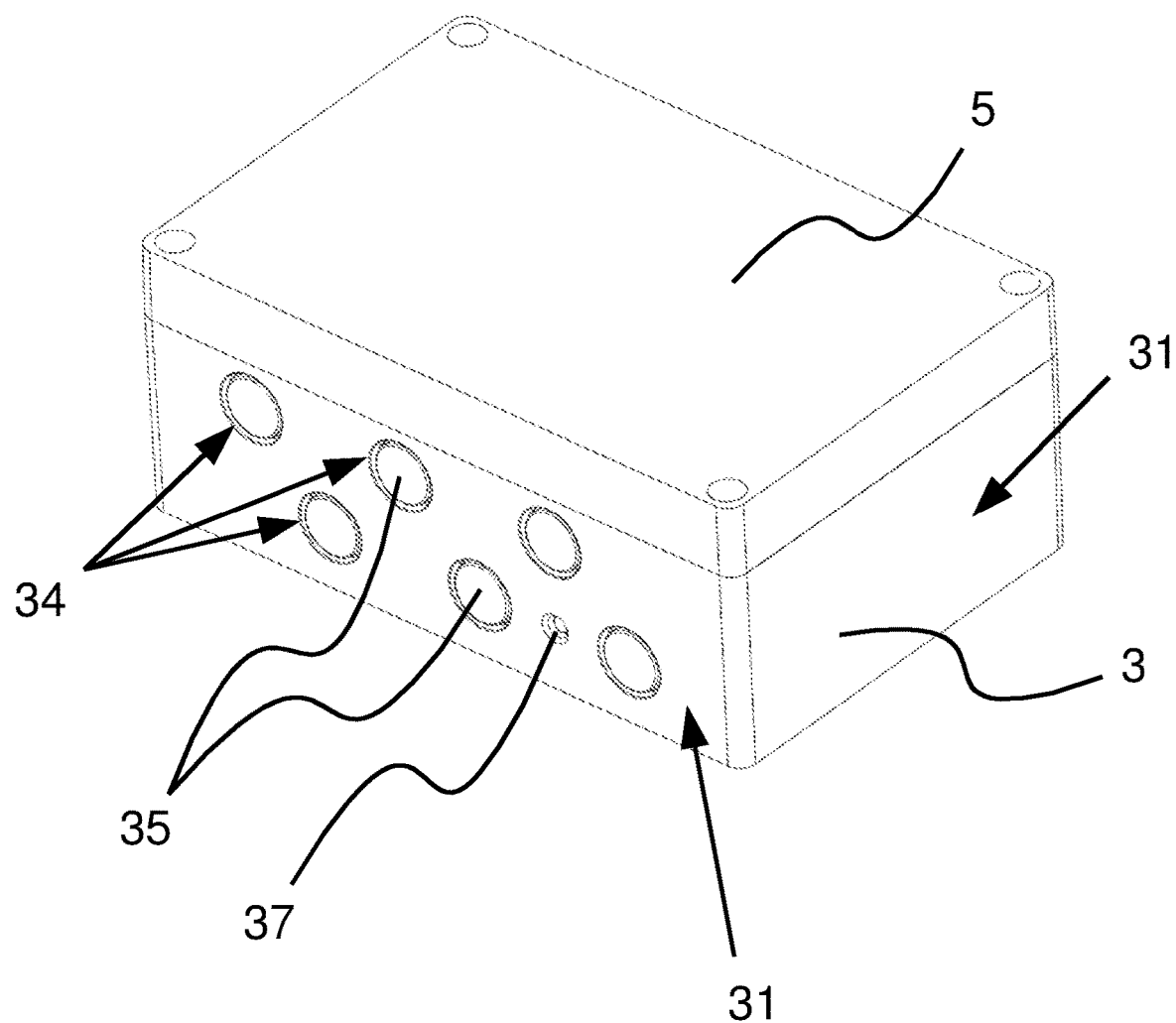
FIG. 1 is a line drawing showing a perspective view of an electrical housing according to the present application.

The invention is a plastic electrical housing with a bottom housing part with walls forming a housing bottom and a plurality of side walls, wherein the side walls form a housing opening, wherein at least one of the walls has a plurality of positions for arranging cable glands. The electrical housing further includes a top housing part adapted to the bottom housing part for closing the housing opening in a sealing manner, and is characterized in that at least one metallic screw connection plate with threads for the attachment of cable glands integrated into the screw connection plate is disposed in the housing interior, wherein the screw connection plate is oriented and arranged such that the threads are oriented so as to correspond to the positions.

The screw connection plate affords a mechanical attaching means for several cable glands made from plastic or metal, for example.

If the screw connection plate is used, the use of nuts for the screw connection of the cable gland can be dispensed with because this function is performed by the screw connection plate. The otherwise necessary "holding" of the nut by means of a tool can be dispensed with because the rotation of the screw connection plate in the interior of the housing is prevented by constructional measures in the housing design. The screw connection plate is unable to rotate along with the cable gland when it is screwed in. A simpler assembly process for the user is thus obtained.

Due to the omission of additional screw connection nuts in the interior of the housing, which is made possible by the screw connection plate, a tool-free assembly of the cable glands in the housing interior is achieved. Only in the external region of the housing does the cable gland have to mounted by means of a tool (e.g. an open-ended wrench), for generating a defined torque, in order to prevent the screw connection from becoming disengaged of its own accord.

Due to the omission of screw connection nuts, which is made possible by the screw connection plate, the construction space required therefor can also be made smaller. If nuts are used, the use of tools, e.g. the use of a ring wrench, open-ended wrench or socket wrench, in the interior of the housing is necessary. By using the screw connection plate, this space requirement can be significantly reduced because no tool needs to be used within the housing. As a result, the entire housing can be designed to be smaller.

The screw connection plate is not visible from outside the housing. As a result, the design of the housing is not affected.

For securing and orienting the screw connection plate relative to the housing the electrical housing may have a guide for the screw connection plate.

The guide may be configured in such a way that the screw connection plate is secured in a clamping manner. In this way, it can be ensured that the screw connection plate is fixed in the housing and is unable to slip. The screw connection plate may also have at least one stop, by means of which an orientation of the screw connection plate relative to the housing is ensured.

In the case of assembled cable glands, the screw connection plate is fastened and positioned by means of the cable glands themselves. In the non-assembled state, i.e. when no cable glands have been inserted, fastening is effected by the guides integrated into the plastic housing, which exert a clamping action on the screw connection plate by means of a corresponding oversize.

The walls of the electrical housing, as it is described in the present case, may have break-out openings at those positions corresponding to which threads of the screw connection plate are disposed. Break-out openings are optional openings in the walls through which cable glands, for example, may be inserted into the housing. For this purpose, the break-out openings are formed by weakened portions of the material of the wall, which are formed so as to correspond to the desired shape of the break-out opening and which may be pierced with a screwdriver and thus broken out of the wall in a defined shape. In this way, the housing can be flexibly extended. For example, different numbers of cable glands may be attached as required.

The screw connection plate may have at least one grounding lug. In this way, the components connected to the screw connection plate can be very easily connected to ground. If metallic cable glands are used, for example, the effect of the metallic screw connection plate is that the glands are electrically coupled to one another. As a result, a protective grounding, for example, can be transferred onto the metallic cable glands.

Furthermore, the grounding lugs may each have at least one threaded bore in which a clamping screw can be disposed. It is thus made possible that a cable shield or a PEN conductor inserted through the cable entry point can be connected. As a result, a continuous protective grounding can be obtained, which includes all screwed-in components.

Due to the option of connecting the protective grounding via the lugs of the screw connection sheet in the interior of the housing, this protective grounding connection is protected against weather conditions outside the housing, so that weathering caused thereby is significantly reduced.

Preferably, the cable glands are connected to the screw connection plate in an electrically conductive manner, so that all cable glands have a common potential. For this purpose, the cable glands are preferably made from a metal.

Further, the screw connection plate may have at least one additional thread for the attachment of an external grounding, which may be inserted into the housing via a corresponding break-out opening.

An additional connection socket can be screwed via the additional opening into the screw connection plate from outside the housing. As a result, it is possible, for example, to connect a protective grounding means provided outside the housing to the screw connection plate from the outside, so that no cable gland has to be used for this connection.

In addition to the connecting option in the housing interior, the housing thus has a connecting option outside of a sealing area of the housing.

Connecting a functional grounding over a short distance to this additional grounding option from outside the housing improves or ensures the electromagnetic compatibility (EMC) of signal lines. A user is able to connect a cable shield of a sensor line, for example, to the functional grounding over a short distance. For example, this is necessary for the functional grounding of a communication line in order to ensure and improve electromagnetic compatibility (EMC), e.g. for a HART (Highway Addressable Remote Transducer) communication with a sensor.

The additional grounding may have a clamping screw connection, which provides an option for connecting a conductor. In order to prevent the threaded connection with the screw connection sheet from also loosening when the clamping screw connection is loosened, the additional thread may be realized as a fine thread. Thus, the friction within the thread is increased, so that a higher force is required for screw connections in the additional thread than for loosening the clamping screw connection.

Additionally, an increased frictional force may also be generated by means of an O-ring. Therefore, it is advantageous if the external grounding is sealed by means of an O-ring.

The cable gland may also be advantageously sealed by means of O-rings, so that the electrical housing is configured to be splash-proof, for example.

Advantageously, the housing is made from a polymer material, such as from polycarbonate, for instance.

The screw connection plate made from metal, preferably stainless steel for reasons or corrosion resistance, which is mounted in the interior of the plastic housing, combines several functions. Mechanically, it has several larger threaded bores which the connection threads of cable glands can engage. Thus, the screw connection plate acts as a substitute for screw connection nuts. Several electrotechnical functions are also integrated. A protective grounding can be connected by means of the grounding lugs, into which one clamping screw with a clamping plate is respectively screwed. For example, a cable shield or PEN (Protective Earth and Neutral) conductor of a connecting cable can be connected. Because of the presence of several grounding lugs, it is possible to couple several connecting cables with, for example, the electric potential of the PEN conductor.

DETAILED DESCRIPTION OF THE FIGURES

FIG. 1 shows a perspective view of an electrical housing 1 according to the present application in a perspective illustration.

The electrical housing 1 substantially consists of a bottom housing part 3 and a top housing part 5, which is adapted to the bottom housing part 3 and closes the bottom housing part 3 in a sealing manner. The bottom housing part 3 has a plurality of side walls 31, which, together with a housing bottom 30, form the bottom housing part 3. Break-out openings 35 are formed in one of the side walls 31 at several positions 34. In the present exemplary embodiment, the break-out openings 35 are formed in the side wall 31 by grooves with a circular configuration. Due to the grooves, a wall thickness of the side wall 31 is reduced in the region of the groove, so that the part of the side wall 31 surrounded by the groove can be broken out of the former. Cable glands 40 may be disposed in the break-out openings 35. Such cable glands 40 are generally used for being able to introduce cables into the interior of a housing 1 in a sealing manner.

The side wall 31 further has an additional break-out opening 37 in which a bolt 81 for an external grounding 80 can be fixed. Such an external grounding 80 may be, for example, a functional grounding of a communication line according to the HART protocol.

Figure 2:
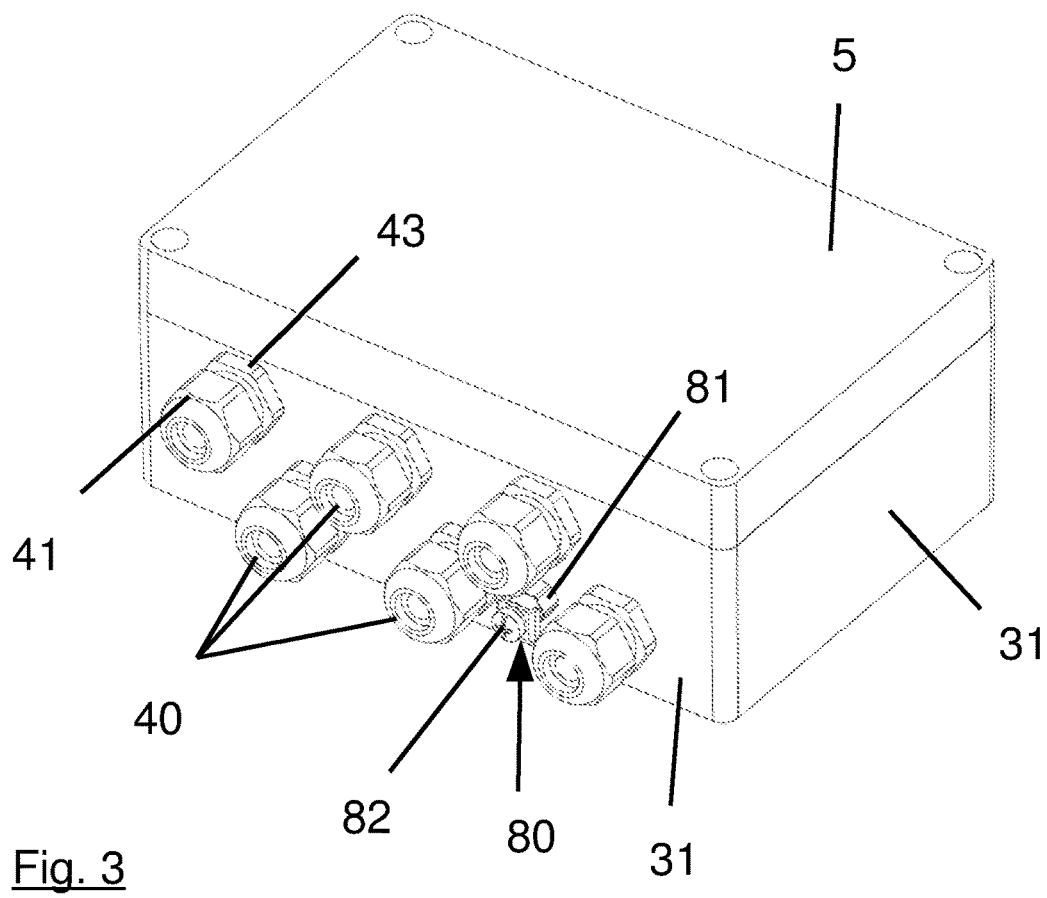
FIG. 2 is a line drawing showing the electrical housing from FIG. 1 in the fully developed state.

The electronic housing 1 from FIG. 1 with the inserted cable glands 40 is again shown in FIG. 2. In the exemplary embodiment shown, the break-out openings 35 are removed at all positions 34 from the side wall 31 of the housing 1 and provided with cable glands 40. The additional break-out opening 37 is also equipped with a bolt 81 for attaching the external grounding 80. The cable glands 40 have a clamping nut 41 by means of which a cable inserted into the cable glands 40 is clamped into the latter. For attaching the cable glands 40, the latter further include a tool region 43, which in the present exemplary embodiment is configured as an external hexagon. Thus, the cable glands 40 can be fixed in the electronic housing 1 by means of an open-ended wrench.

Figure 3:
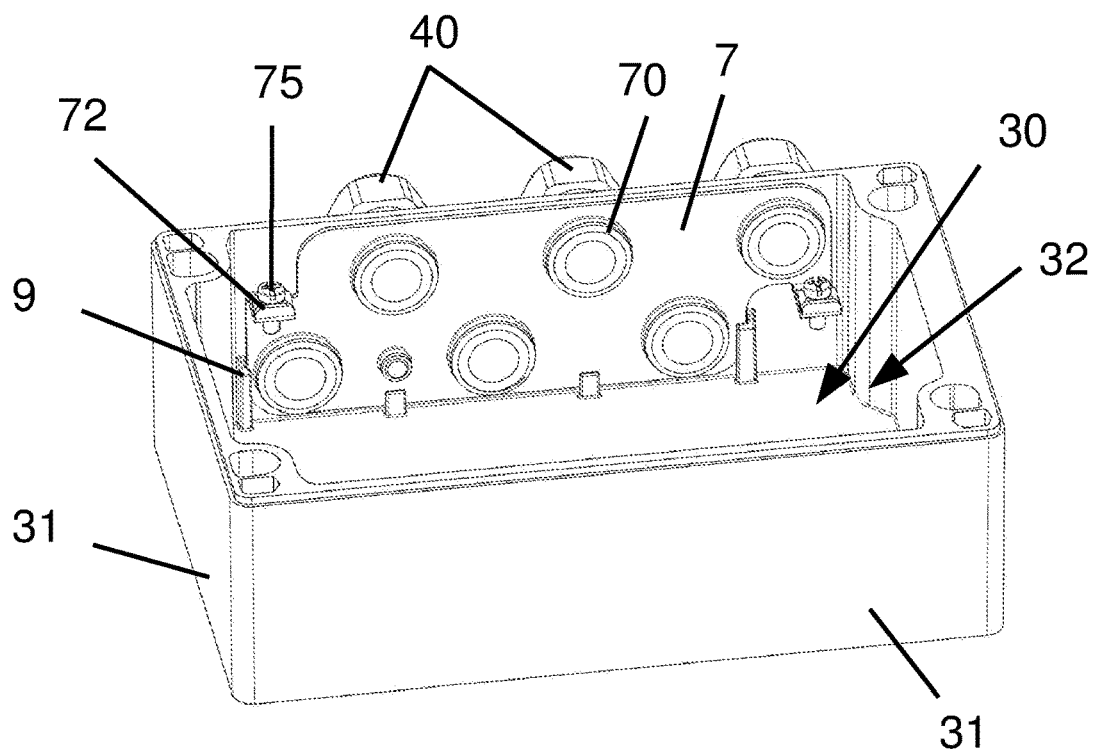
FIG. 3 is a line drawing showing the electrical housing from FIG. 2 in an opened state.

The bottom housing part 3 of the fully equipped electronic housing 1 shown in FIG. 2 is shown in FIG. 3. The illustration of FIG. 3 clearly shows that a screw connection plate 7 is disposed in the housing interior of the electrical housing 1, behind the side wall 31 provided with the break-out openings 35, 37. At the locations corresponding to the positions 34, the screw connection plate 7 has threads 73 disposed in the screw connection plate 7. With threads that are configured so as to correspond thereto, the cable glands 40 are screwed directly into the screw connection plate 7 through the break-out openings 35.

The screw connection plate 7 further comprises two grounding lugs 72 bent away from the screw connection plate 7 at right angles. The grounding lugs 72 are each provided with a thread 73 into which a clamping screw 75 is screwed. Using this clamping screw 75, a grounding cable can be connected to the grounding lugs 72 in the interior of the housing 1. Due to the metallic screw connection plate 7, the grounding thus applied is available at all cable glands 40 and at the bolt 81 of the external grounding 80. For this purpose, the cable glands 40 are preferably formed from metal.

The screw connection plate 7 is laterally guided by means of a guide 9 in the interior of the housing 1 and, at the same time, is oriented relative to the positions 34 of the break-out opening 35 by means of this guide 9. At the same time, the guide 9 can be configured in such a manner that the screw connection plate 7 is secured in a clamping manner, so that the latter remains positioned in an oriented manner even without inserted cable glands 40. In the present exemplary embodiment, additional tabs are disposed on the housing bottom 30 of the electronic housing 1, in addition to the lateral guides 9.

Figure 4:
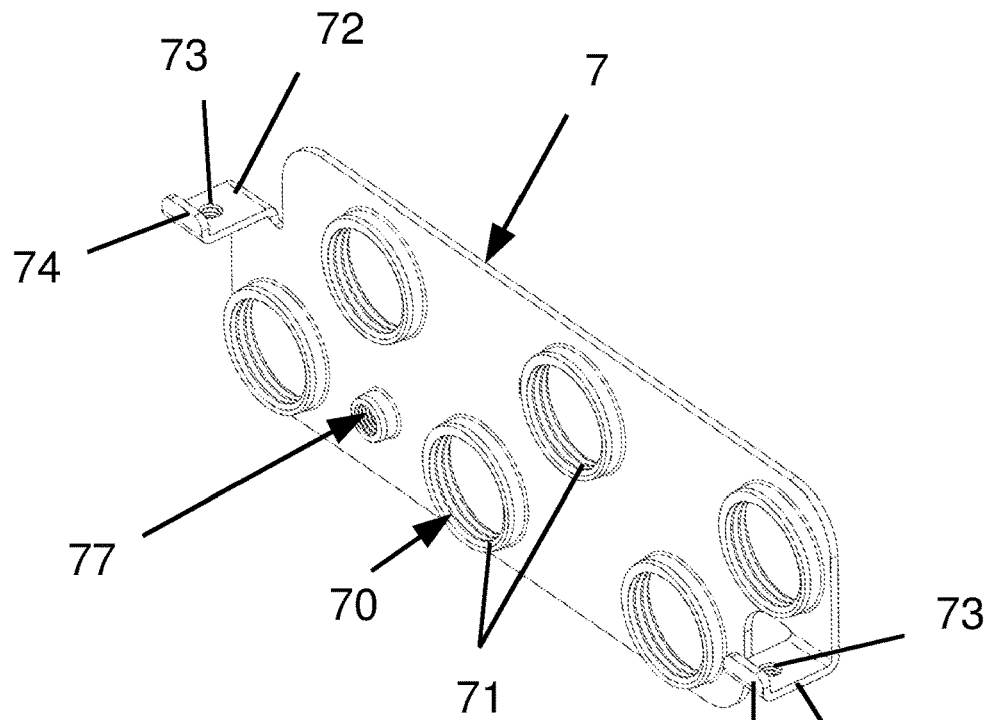
FIG. 4 is a line drawing showing the screw connection plate of the electrical housing from FIG. 3 in an enlarged illustration.

The screw connection plate 7 from FIG. 3 is shown enlarged in FIG. 4.

In this embodiment, the screw connection plate 7 is a stamped bent part made from a metal sheet. Thus, a simple and inexpensive production is possible. In the illustration according to FIG. 4, the grounding lugs 72 are shown without the clamping screws 75, so that the thread 73 is clearly recognizable. On the inside, the grounding lugs 72 have a tab 74 in the form of a bent portion, so that a cable can be clamped between the clamping screw 75 and the tab 74.

Figure 5:
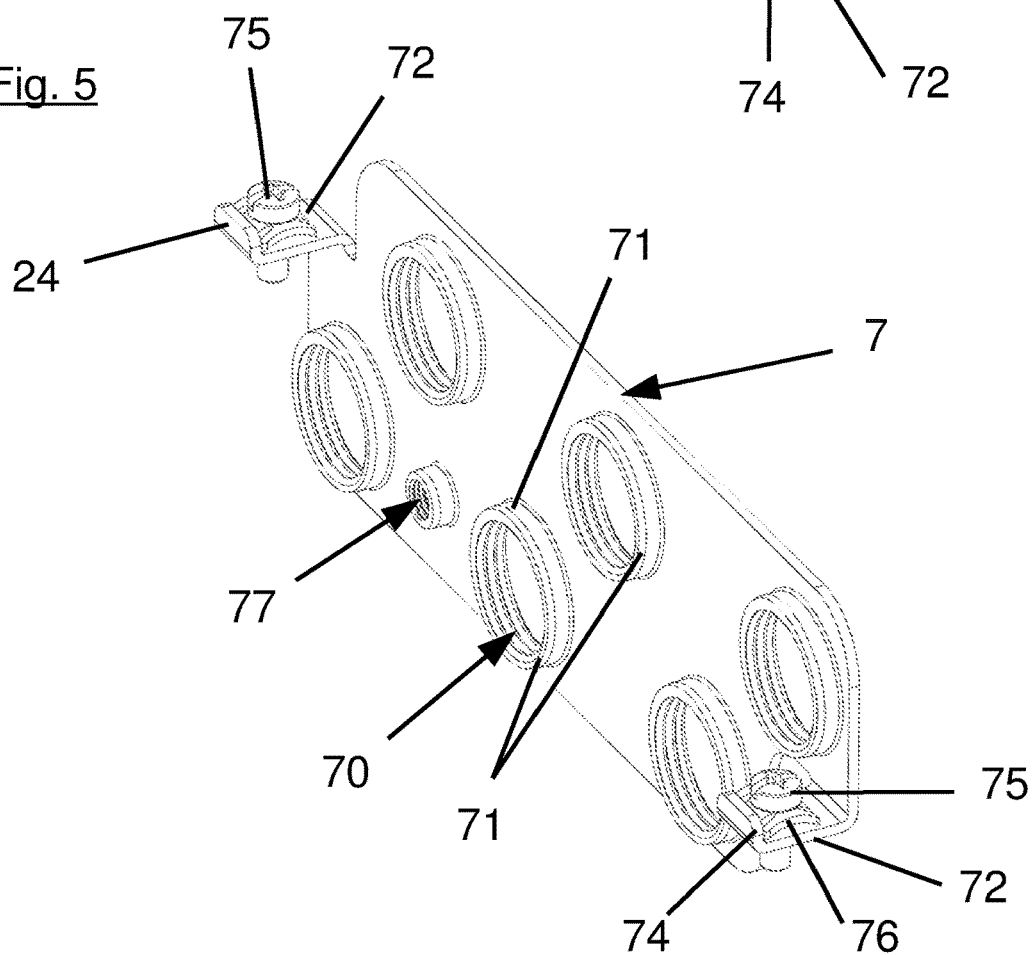
FIG. 5 is a line drawing showing the screw connection plate from FIG. 4 with the clamping screws inserted.

At the circumference of the threads 70, the screw connection plate 7 has an edge 71 which was created during the stamp-bending process and which may serve for accommodating additional thread turns. FIG. 5 shows the screw connection plate 7 from FIG. 4 with the clamping screws 75 inserted into the grounding lugs 72. In the embodiment shown in FIG. 5, a clamping plate 76 is additionally disposed between the clamping screws 75 and the grounding lugs 72, by means of which the grounding cable can be clamped between the clamping screw 75 and the grounding lug 72 even more easily.

Figure 6:
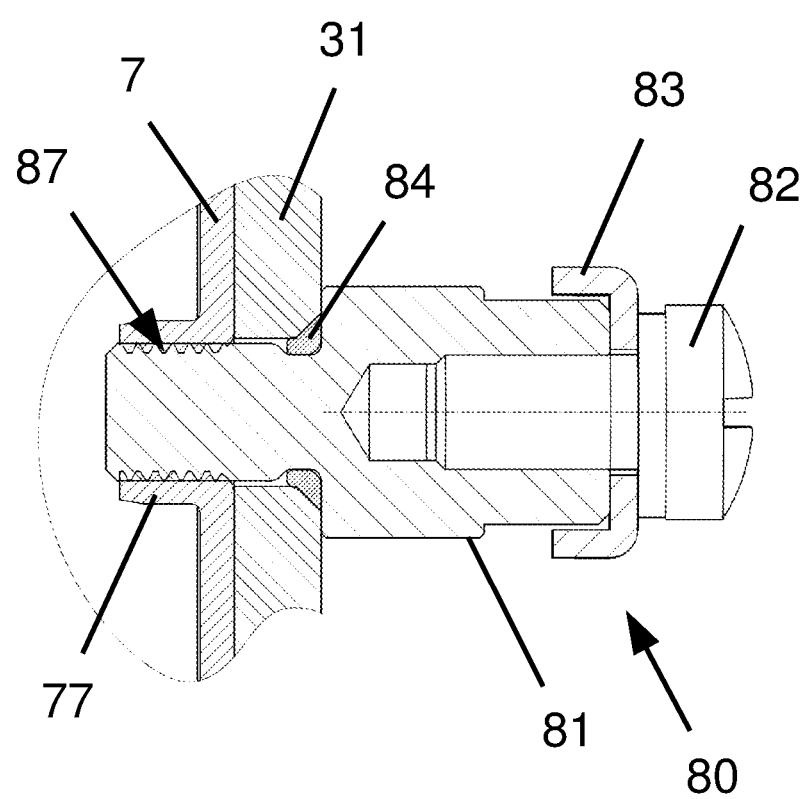
FIG. 6 is a line drawing showing a longitudinal section through an external grounding from the FIGS. 2 to 5.

FIG. 6 shows a longitudinal section through the external grounding 80. The external grounding 80 is substantially formed as a screw-in bolt 81 which, on one end, has a clamping screw 82 securing a clamping plate 83 in the screw-in bolt 81, and, on the other end, is screwed into the additional thread 77 of the screw connection plate 7 by means of a fine thread 87. An O-ring 84 for sealing is disposed between a shoulder of the screw-in bolt 81 and the side wall 31 of the electronic housing 1. The screw-in bolt 81 also has a tool region for screwing the screw-in bolt 81 into the screw connection plate 7 of the electronic housing 1.

Basically, O-rings for sealing may be disposed between the electronic housing 1 and the cable glands 40.

Because the screw connection plate 7 is formed from an electrically conductive material, in particular a metal, and because the cable glands 40 are formed from an electrically conductive material, in particular a metal, it is possible that the cable glands 40 are connected to ground via the grounding internally connected to the grounding lugs 72. As a result, the present plastic electronic housing 1 can also be used in explosion-hazard environments. A classification in accordance with ATEX/IEC Ex is can thus be achieved.

LIST OF REFERENCE NUMERALS

1 Electrical housing
3 Bottom housing part
5 Top housing part
7 Screw connection plate
9 Guide
30 Housing bottom
31 Side wall
32 Housing opening
34 Positions
35 Break-out openings
37 Additional break-out openings
40 Cable glands external grounding
41 Clamping nut
43 Tool region
70 Thread
71 Edge
72 Grounding lug
73 Thread
74 Tab
75 Clamping screw
76 Clamping plate
77 Additional thread
80 External grounding
81 Screw-in bolt
82 Clamping screw
83 Clamping plate
84 O-ring
87 Fine thread

We claim:

1. An electrical housing made from plastic, comprising:
a bottom housing part having a housing bottom and a plurality of side walls, wherein the side walls form a housing opening, wherein at least one of the side walls has a plurality of positions for arranging cable glands, and
a top housing part adapted to the bottom housing part for closing the housing opening in a sealing manner,
wherein at least one metallic screw connection plate with threads for attachment of the cable glands integrated into the screw connection plate is disposed in an interior of the electrical housing, and
wherein the screw connection plate is oriented and arranged such that the threads are oriented so as to correspond to the positions.

2. The electrical housing according to claim 1, wherein the housing has a guide for the screw connection plate.

3. The electrical housing according to claim 2, wherein the guide is configured in such a way that the screw connection plate is secured in a clamping manner.

4. The electrical housing according to claim 1, wherein the side walls have break-out openings at the positions.

5. The electrical housing according to claim 1, characterized in that the screw connection plate has at least one grounding lug.

6. The electrical housing according to claim 5, wherein the cable glands are connected to the screw connection plate in an electrically conductive manner.

7. The electrical housing according to claim 6, wherein the cable glands are made from a metal.

8. The electrical housing according to claim 6, wherein the additional thread is configured as a thread.

9. The electrical housing according to claim 6, wherein that the external grounding is sealed by means of an O-ring.

10. The electrical housing according to claim 1, wherein the screw connection plate has at least one additional thread for the attachment of an external grounding.

11. The electrical housing according to claim 1, wherein the cable glands are sealed by means of O-rings.

12. The electrical housing according to claim 1, wherein the housing is made from a polymer material.

* * * * *